US010361114B2

(12) United States Patent
Wei et al.

(10) Patent No.: US 10,361,114 B2
(45) Date of Patent: Jul. 23, 2019

(54) METHOD FOR PREPARING SUBSTRATE WITH CARRIER TRAPPING CENTER

(71) Applicant: Shanghai Simgui Technology Co., Ltd., Shanghai (CN)

(72) Inventors: Xing Wei, Shanghai (CN); Yongwei Chang, Shanghai (CN); Meng Chen, Shanghai (CN); Guoxing Chen, Shanghai (CN); Lu Fei, Shanghai (CN); Xi Wang, Shanghai (CN)

(73) Assignee: SHANGHAI SIMGUI TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 15/905,492

(22) Filed: Feb. 26, 2018

(65) Prior Publication Data

US 2018/0190539 A1 Jul. 5, 2018

(30) Foreign Application Priority Data

Dec. 27, 2016 (CN) .......................... 2016 1 1225996

(51) Int. Cl.
*H01L 21/762* (2006.01)
*H01L 21/3115* (2006.01)
(Continued)

(52) U.S. Cl.
CPC .. *H01L 21/76254* (2013.01); *H01L 21/31155* (2013.01); *H01L 21/3226* (2013.01); *H01L 23/552* (2013.01)

(58) Field of Classification Search
CPC ......... H01L 21/76254; H01L 21/31155; H01L 21/3226; H01L 21/322; H01L 21/3221; H01L 21/3223; H01L 21/3225
See application file for complete search history.

(56) References Cited

U.S. PATENT DOCUMENTS 7,741,193 B2    6/2010  Park
9,275,892 B2    3/2016  Daix
(Continued)

FOREIGN PATENT DOCUMENTS

CN    1241803 A    1/2000
CN    101901754    12/2010
CN    102290369    12/2011

OTHER PUBLICATIONS

Chinese Office Action (including English translation) issued in corresponding CN Patent Application No. 201611227767.3, dated Nov. 20, 2018, 11 pages.

*Primary Examiner* — Sonya D. McCall-Shepard
(74) *Attorney, Agent, or Firm* — Arch & Lake LLP

(57) ABSTRACT

The present disclosure provides a method for preparing a substrate with a carrier trapping center. The method includes: implanting bubbling ions into the semiconductor substrate to form a splitting layer, and implanting modified ions into the insulating layer to form a nano cluster; providing a supporting substrate; bonding the supporting substrate to the semiconductor substrate by using the insulating layer as an intermediate layer; performing a first heat treatment for the bonded substrate such that a splitting layer is formed at the position where the bubbling ions are implanted, and causing the semiconductor substrate to split at the position of the splitting layer; performing rapid thermal annealing for the substrate; and performing a second heat treatment for the rapidly thermally annealed semiconductor substrate to consolidate the bonding interface and form the nano cluster at the position where the modified ions are implanted.

10 Claims, 3 Drawing Sheets

(51) Int. Cl.
*H01L 21/322* (2006.01)
*H01L 23/552* (2006.01)

(56) References Cited

U.S. PATENT DOCUMENTS

| | | |
|---|---|---|
| 2003/0189229 A1 | 10/2003 | Mouli |
| 2004/0029358 A1 | 2/2004 | Park |
| 2004/0171196 A1* | 9/2004 | Walitzki ............ H01L 21/76254 |
| | | 438/137 |
| 2006/0099791 A1 | 5/2006 | Mitani |
| 2009/0098704 A1 | 4/2009 | Ohnuma |
| 2010/0187649 A1* | 7/2010 | Allibert ............. H01L 21/02126 |
| | | 257/506 |
| 2018/0190539 A1 | 7/2018 | Wei |
| 2018/0197741 A1 | 7/2018 | Wei |

* cited by examiner

US 10,361,114 B2

METHOD FOR PREPARING SUBSTRATE WITH CARRIER TRAPPING CENTER

The present application is based on and claims the priority to Chinese patent application No. CN201611225996.1, filed on Dec. 27, 2016, which is incorporated by reference herein in its entirety.

TECHNICAL FIELD

The present disclosure relates to the field of semiconductor materials, and in particular, relates to a method for preparing a substrate with a carrier trapping center.

BACKGROUND

In the prior art, a typical substrate structure with an insulating buried layer includes three layers, which are sequentially a supporting layer, an insulating layer on the surface of the supporting layer, and a device layer on the surface of the insulating layer. In some application scenarios, to prevent carriers from being excited by high-energy rays and thus migrating from the exterior of the substrate, a layer of carrier trapping center needs to be introduced to the substrate to trap these carriers, so as to improve the electrical properties of the electronic devices in the device layer. However, in practice, to introduce the carrier trapping center, extra modified ions need to be introduced by means of implantion and the like, and thus the process is very complicated. The complicated preparation process causes damages to the lattice of the device layer, and thus lowers the electrical properties of the electronic devices in the device layer. Therefore, how to optimize the preparation process to reduce the damages caused to the lattice of the device layer is a problem to be urgently addressed in the prior art.

SUMMARY

The technical problem to be solved by the present disclosure is to provide a method for preparing a substrate with a carrier trapping center, which improves crystal quality of a device layer.

The present disclosure provides a method for preparing a substrate with a carrier trapping center. The method includes: implanting bubbling ions into the semiconductor substrate to form a splitting layer, and implanting modified ions into the insulating layer to form a nano cluster; providing a supporting substrate; bonding the supporting substrate to the semiconductor substrate by using the insulating layer as an intermediate layer; performing a first heat treatment for the bonded substrate such that a splitting layer is formed at the position where the bubbling ions are implanted, and causing the semiconductor substrate to split at the position of the splitting layer; performing rapid thermal annealing for the substrate; and performing a second heat treatment for the rapidly thermally annealed semiconductor substrate to consolidate the bonding interface and form the nano cluster at the position where the modified ions are implanted.

Optionally, the rapid thermal annealing has a temperature rise step of greater than 5° C./second, and the temperature reaches a target temperature and is maintained for over 5 minutes.

Optionally, the second heat treatment further includes: performing a first annealing step, wherein the first annealing step is practiced in an oxygen-containing atmosphere, and an oxidation layer is formed on a surface of the substrate through the annealing step, the oxidation layer having a thickness of greater than 40 nm; and performing a second annealing step upon the first annealing step, wherein a temperature of the second annealing step is higher than that of the first annealing step. The first annealing step is performed within a temperature range of 900° C. to 1350° C. The second annealing step is performed within a temperature range of 1000° C. to 1350° C.

Optionally, the first annealing step is practiced in a dry oxygen environment. Optionally, the second annealing step is practiced in an oxygen-free environment.

Optionally, the modified ions are derived from one of chemical elements forming the insulating layer, or the modified ions are derived from a congener in chemical elements forming the insulating layer. The insulating layer is made from silicon dioxide, and the modified ions are silicon or germanium ions.

Optionally, the first heat treatment is performed within a temperature range of 300° C. to 800° C.

Optionally, the surface of the supporting substrate for bonding is provided with an oxidation layer.

Optionally, the method further includes a thinning step of thinning the semiconductor substrate bonded to the insulating layer; wherein the semiconductor substrate is thinned by a thickness of 10 nm to 150 nm, and this step is practiced between the first heat treatment and the second heat treatment, and practiced before or after the rapid thermal annealing.

The present disclosure is advantageous in that upon splitting, dislocations on a release surface upon rapid thermal annealing are restored, and then a nano cluster is formed via heat treatment. The annealing process forming the nano cluster takes a long time and is carried out in at a high temperature, and the rapid thermal annealing process is performed in advance to remove the dislocations, thereby preventing the dislocations from growing to the entire device layer at the high temperature, and improving crystal quality of a resulted device layer.

DETAILED DESCRIPTION

Specific embodiments illustrating a method for preparing a semiconductor substrate with a carrier trapping center according to the present disclosure are described in detail with reference to the accompanying drawings.

Figure 1:
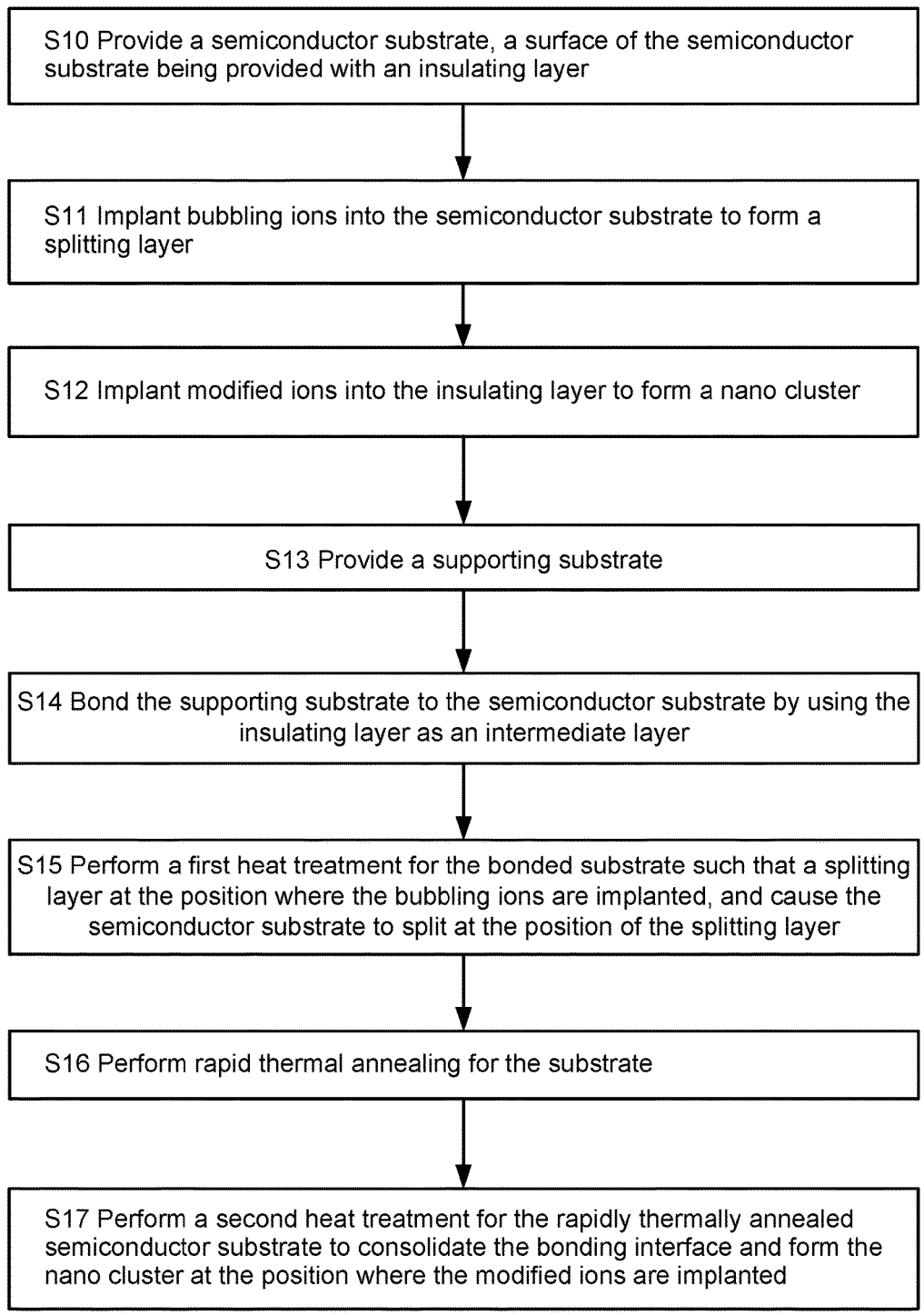
FIG. 1 is a schematic flowchart of a method for preparing a semiconductor substrate with a carrier trapping center according to an aspect of the present disclosure.

FIG. 1 is a schematic flowchart of a method for preparing a semiconductor substrate with a carrier trapping center according to an aspect of the present disclosure. The method includes: step S10 providing a semiconductor substrate, a surface of the semiconductor substrate being provided with an insulating layer; step S11 implanting bubbling ions into the semiconductor substrate to form a splitting layer; step S12 implanting modified ions into the insulating layer to form a nano cluster; step S13 providing a supporting substrate; step S14 bonding the supporting substrate to the semiconductor substrate by using the insulating layer as an intermediate layer; step S15 performing a first heat treatment for the bonded substrate such that a splitting layer at the position where the bubbling ions are implanted, and causing the semiconductor substrate to split at the position of the splitting layer; step S16 performing rapid thermal annealing for the substrate; and step S17 performing a second heat treatment for the rapidly thermally annealed semiconductor substrate to consolidate the bonding interface and form the nano cluster at the position where the modified ions are implanted.

Figure 2A:
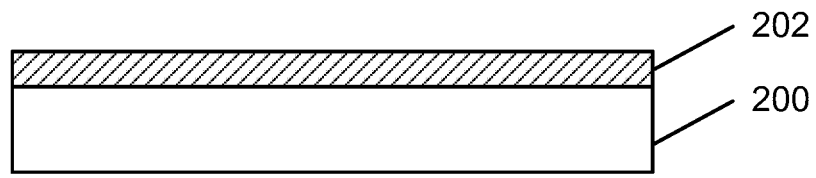
FIG. 2A illustrates the semiconductor substrate corresponding to a step in a schematic process diagram according to an aspect of the present disclosure.
Figure 2B:
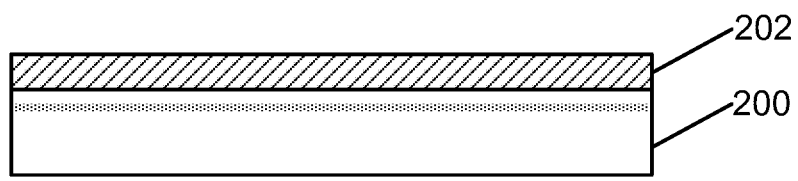
FIG. 2B illustrates the semiconductor substrate corresponding to a step in a schematic process diagram according to an aspect of the present disclosure.
Figure 2C:
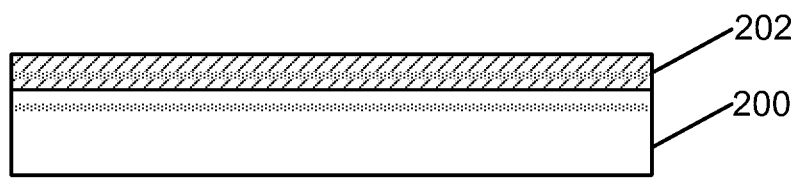
FIG. 2C illustrates the semiconductor substrate corresponding to a step in a schematic process diagram according to an aspect of the present disclosure.

FIG. 2A to FIG. 2C are schematic process diagrams according to an aspect of the present disclosure.

As illustrated in FIG. 2A, referring to step S10, a semiconductor substrate 200 is provided, wherein a surface of the semiconductor substrate 200 is provided with an insulating layer 202. In this specific embodiment, the semiconductor substrate 200 is made from silicon, and the insulating layer 202 is made from silicon dioxide. In another specific embodiment, the semiconductor substrate 200 may be made from germanium-silicon, germanium or a compound semiconductor or the like, and the insulating layer 202 may be made form silicon nitride, silicon oxynitride, germanium-silicon oxide, or another commonly used insulating material.

As illustrated in FIG. 2B, referring to step S11, bubbling ions are implanted into the semiconductor substrate 200 to form a splitting layer. The bubbling ions may be argon ions, nitrogen ions, or a mixture thereof. After the above ions are implanted, a bubbling layer is formed at a high temperature, such that the semiconductor substrate 200 is subjected to cracking or splitting. With respect to H ions, generally the implanted energy is 5 keV to 500 keV, and the implantion amount is $1 \times 10^{15}$ to $3 \times 10^{17}$ cm$^2$.

As illustrated in FIG. 2C, referring to step S12, modified ions are implanted into the insulating layer 102 to form a nano cluster. In this specific embodiment, the modified ions are derived from by silicon, such that a silicon-enriched layer is formed in the insulating layer 202, and thus a silicon-enriched nano cluster is formed upon a further heat treatment. In another specific embodiment, the modified ions may be derived from one of chemical elements forming the insulating layer, for example, germanium or silicon is implanted into germanium-silicon oxide. Alternatively, the modified ions may also be derived from a congener in chemical elements forming the insulating layer, for example, germanium is implanted into silicon oxide. Since the congeners have approximate chemical properties, a nano cluster that is capable of effectively trapping carriers may also be formed. With respect to silicon ions, generally the implanted energy is 5 keV to 500 keV, and the implantation amount is $1 \times 10^{15}$ to $3 \times 10^{17}$ cm$^{-2}$, and the implantation position is preferably proximate to the interface between the insulating layer 202 and the semiconductor substrate 200.

The sequence for performing step S11 and step S12 is not definite.

Figure 2D:
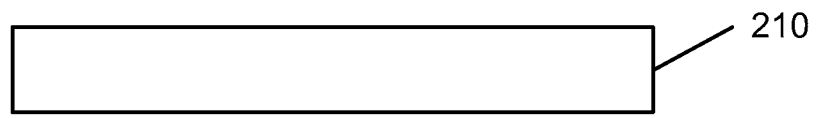
FIG. 2D illustrates the semiconductor substrate corresponding to a step in a schematic process diagram according to an aspect of the present disclosure.

As illustrated in FIG. 2D, referring to step S13, a supporting substrate 210 is provided. In this specific embodiment, the supporting substrate 210 may be made from silicon. In another specific embodiment, the supporting substrate 210 may be made from germanium-silicon, germanium or a compound semiconductor or the like, or sapphire, silicon carbide and the like commonly used substrate material.

Figure 2E:
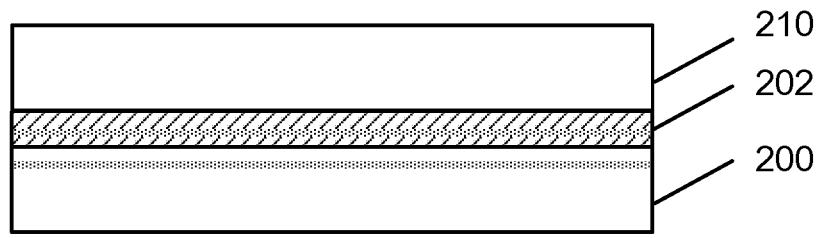
FIG. 2E illustrates the semiconductor substrate corresponding to a step in a schematic process diagram according to an aspect of the present disclosure.

As illustrated in FIG. 2E, referring to step S14, the supporting substrate 210 is bonded to the semiconductor substrate 200 by using the insulating layer 202 as an intermediate layer. In this step, common bonding or plasma-assisting bonding is employed. In the above step, the surface of the supporting substrate 210 for bonding may also be provided with an oxidation layer, and the oxidation layer and the insulating layer 202 form an insulating buried layer in the bonding step.

Figure 2F:
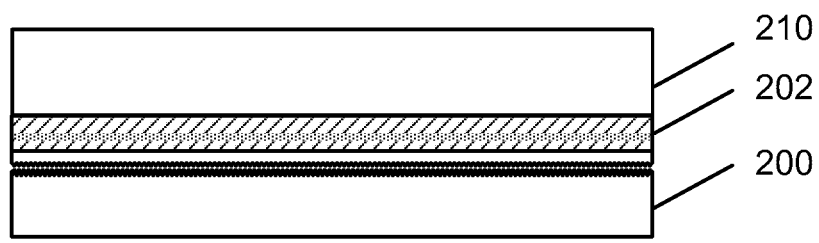
FIG. 2F illustrates the semiconductor substrate corresponding to a step in a schematic process diagram according to an aspect of the present disclosure.

As illustrated in FIG. 2F, referring to step S15, a first heat treatment is performed for the bonded substrate such that a splitting layer at the position where the bubbling ions are implanted, and the semiconductor substrate is caused to split at the position of the splitting layer. This step is preferably performed within a temperature range of 300° C. to 800° C.

Figure 2G:
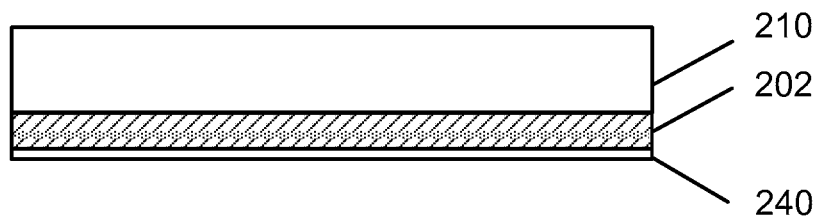
FIG. 2G illustrates the semiconductor substrate corresponding to a step in a schematic process diagram according to an aspect of the present disclosure.

As illustrated in FIG. 2G, referring to step S16, rapid thermal annealing is practiced for the substrate. In FIG. 2G, a part of the supporting substrate 213 reserved in the bonded substrate after splitting forms a device layer 240, wherein the device layer 240 may be configured to prepare a semiconductor device. The nano cluster formed at the position where the modified ions are implanted may trap the carriers in the device layer 240. In this step, the rapid thermal annealing has a temperature rise step of greater than 5° C./second, and the temperature reaches a target temperature and is maintained for over 5 minutes. The rapid thermal annealing may restore dislocations formed by the splitting step in the interface, and prevent the dislocations from diffusing and growing to the entire device layer 240 during the annealing process which thus lowers crystal quality of the device layer 240.

Between step S16 and step S15, the method further includes a thinning step of thinning the semiconductor substrate 200 bonded to the insulating layer 202, wherein the semiconductor substrate 200 is thinned by a thickness of 10 nm to 150 nm to further remove dislocations. This prevents the dislocations from growing to the entire device layer at the high temperature, and improves crystal quality of a finally resulted device layer. This thinning step may also be performed between step S16 and step S17.

Referring to step S17, a second heat treatment is performed for the rapidly thermally annealed substrate to consolidate the bonding interface and form the nano cluster at the position where the modified ions are implanted. In this step, the heat treatment is preferably performed within a temperature range of 900° C. to 1350° C. This step employs two heat treatment processes. In the first heat treatment process, the second heat treatment process is performed upon splitting by the first heat treatment and promotes formation of the nano cluster, and further consolidates the bonding interface, such that the process steps are simplified. Upon splitting, the semiconductor layer, that is, the device layer 240, bonded to the insulating layer 202 may be polished.

To improve the capability of the nano cluster in trapping carriers, a preferred specific embodiment involves two steps in the heat treatment: performing a first annealing step, wherein the first annealing step is practiced in an oxygen-containing atmosphere, and an oxidation layer is formed on a surface of the substrate through the annealing step, the oxidation layer having a thickness of greater than 40 nm; and performing a second annealing step, wherein a temperature of the second annealing step is higher than that of the first annealing step.

Specifically, the first annealing step is preferably performed within a temperature range of 900° C. to 1350° C., and is preferably practiced in a wet oxygen environment. In this way, an oxidation protection layer having a thickness of greater than 40 nm may be rapidly formed on the surface of the substrate, wherein the oxidation protection layer may prevent the oxygen element from diffusing to the substrate during the annealing process and bonding to the modified ions, and reducing density of the nano cluster. In addition, this step may also restore or eliminate implantion damages in the semiconductor substrate 200, such that a large number of interstitial silicon atoms in the semiconductor substrate 200 are recombined and released, thereby preventing dislocations and defects. The second annealing step is preferably performed within a temperature range of 1000° C. to 1350° C., and is preferably practiced in an oxygen-free environment, for example, in an argon environment. The annealing at an even higher temperature causes the implanted silicon atoms to aggregate and form a stable nano cluster, and meanwhile further restores integrity of the lattice and reduces dislocation density. Further, the oxygen-free environment prevents the oxygen atom from entering the substrate and bonding to the modified ions. Such bonding may reduce the density of the nano cluster, and thus affect the trapping efficiency of the carrier trapping center.

In the above technical solution, upon splitting, dislocations on the release surface upon rapid thermal annealing process are removed, and then the nano cluster is formed via heat treatment. The annealing process forming the nano cluster takes a long time and is carried out in at a high temperature, and the rapid thermal annealing process is performed in advance to remove the dislocations, thereby preventing the dislocations from growing to the entire device layer at the high temperature, and improving crystal quality of a resulted device layer. In addition, the above two heat treatment processes and the rapid thermal annealing process may be practiced in situ, and the substrate may not be moved during the entire course. Therefore, the process efficiency is also improved.

Described above are preferred examples of the present disclosure. It should be noted that persons of ordinary skill in the art may derive other improvements or polishments without departing from the principles of the present disclosure. Such improvements and polishments shall be deemed as falling within the protection scope of the present disclosure.

What is claimed is:

1. A method for preparing a substrate with a carrier trapping center, comprising:
   providing a semiconductor substrate, a first surface of the semiconductor substrate being provided with an insulating layer;
   implanting bubbling ions into the semiconductor substrate to form a splitting layer, and implanting modified ions into the insulating layer to form a nano cluster;
   providing a supporting substrate for bonding;
   bonding the supporting substrate to the semiconductor substrate by using the insulating layer as an intermediate layer;
   performing a first heat treatment for the bonded substrate such that the splitting layer is formed at the position where the bubbling ions are implanted, and subsequently causing the semiconductor substrate to split at the position of the splitting layer;
   performing rapid thermal annealing for the bonded substrate after the splitting; and
   performing a second heat treatment for the rapidly thermally annealed bonded substrate to consolidate the bonding interface and form the nano cluster at the position where the modified ions are implanted.

2. The method for preparing a substrate with a carrier trapping center according to claim 1, wherein the rapid thermal annealing has a temperature rise step of greater than 5° C./second, and the temperature reaches a target temperature and is maintained for over 5 minutes.

3. The method for preparing a substrate with a carrier trapping center according to claim 1, wherein the second heat treatment further comprises:
   performing a first annealing step, wherein the first annealing step is practiced in an oxygen-containing atmosphere, and an oxidation layer is formed on a first surface of the bonded substrate through the annealing step, the oxidation layer having a thickness of greater than 40 nm; and
   performing a second annealing step after the first annealing step, wherein a temperature of the second annealing step is higher than that of the first annealing step.

4. The method for preparing a substrate with a carrier trapping center according to claim 3, wherein the first annealing step is practiced in a dry oxygen environment.

5. The method for preparing a substrate with a carrier trapping center according to claim 3, wherein the second annealing step is practiced in an oxygen-free environment.

6. The method for preparing a substrate with a carrier trapping center according to claim 1, wherein the modified ions are derived from one of chemical elements forming the insulating layer, or the modified ions are derived from a congener in chemical elements forming the insulating layer.

7. The method for preparing a substrate with a carrier trapping center according to claim 1, wherein the insulating layer is made from silicon dioxide, and the modified ions are silicon or germanium ions.

8. The method for preparing a substrate with a carrier trapping center according to claim 1, wherein the first heat treatment is performed within a temperature range of 300° C. to 800° C.

9. The method for preparing a substrate with a carrier trapping center according to claim 1, wherein a first surface of the supporting substrate for bonding is provided with an oxidation layer.

10. The method for preparing a substrate with a carrier trapping center according to claim 1, further comprising a thinning step of reducing a thickness of the bonded substrate; wherein the thickness is reduced by 10 nm to 150 nm, and this step is practiced between the first heat treatment and the second heat treatment, and practiced before or after the rapid thermal annealing.

* * * * *